United States Patent [19]
Kantner

[11] Patent Number: 5,773,901
[45] Date of Patent: Jun. 30, 1998

[54] UNIVERSAL PC CARD HOST

[76] Inventor: Edward A. Kantner, 5332 Caber Rd., Raleigh, N.C. 27613

[21] Appl. No.: 826,119

[22] Filed: Mar. 27, 1997

Related U.S. Application Data

[63] Continuation-in-part of Ser. No. 505,609, Jul. 21, 1995, Pat. No. 5,627,416.

[51] Int. Cl.⁶ .................................................. H01H 47/00
[52] U.S. Cl. ........................ 307/125; 307/147; 307/112; 361/737; 395/282; 439/64; 439/955
[58] Field of Search ............................. 439/955, 64, 188, 439/489; 361/737, 684, 686; 307/116, 125, 112, 130, 131, 147; 395/280, 281, 282, 283; 365/226, 227, 228, 229

[56] References Cited

U.S. PATENT DOCUMENTS

| | | | |
|---|---|---|---|
| 5,300,765 | 4/1994 | Mizuta | 235/492 |
| 5,404,268 | 4/1995 | O'Connor | 361/683 |
| 5,421,734 | 6/1995 | MacWilliams | 439/59 |
| 5,488,572 | 1/1996 | Belmont | 364/514 R |
| 5,490,117 | 2/1996 | Oda et al. | 365/226 |
| 5,589,719 | 12/1996 | Fiset | 307/131 |
| 5,650,973 | 7/1997 | Moyer et al. | 365/226 |

*Primary Examiner*—William M. Shoop, Jr.
*Assistant Examiner*—Jonathan S. Kaplan

[57] ABSTRACT

An electronic device has a host with a card-receiving slot, with the host being capable of receiving and operating low voltage-low current (3.3 volts and no more than 0.12 amp) cards, low voltage-high current cards, high voltage (5 volts) —low current cards, and high voltage-high current cards. The inner end of the slot has a voltage-discriminating first side and an opposite current-discriminating second side. Each side has a switch with an actuator lying at a location that is occupied by a discrimination key portion that is present in one kind of card (low voltage or low current) but not in another kind of card (high voltage or high current). The electronic device has different circuits for energizing or rejecting the types of card sensed by the switches.

7 Claims, 3 Drawing Sheets

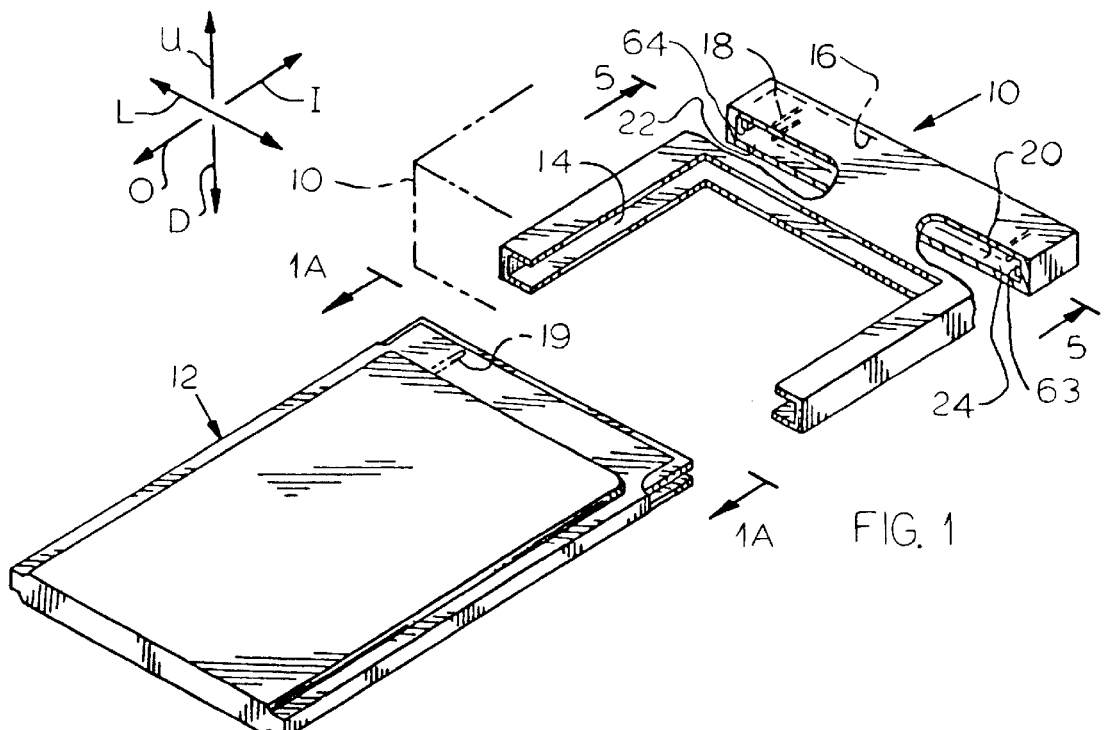
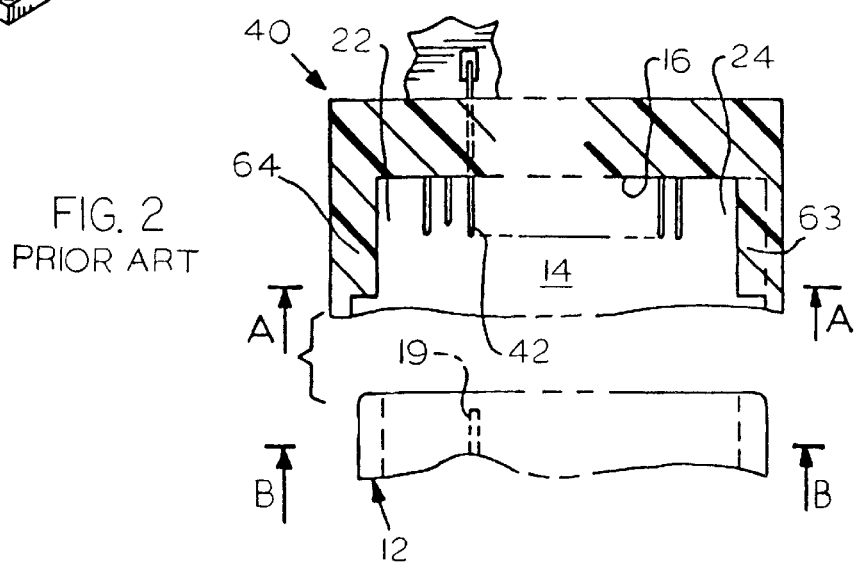
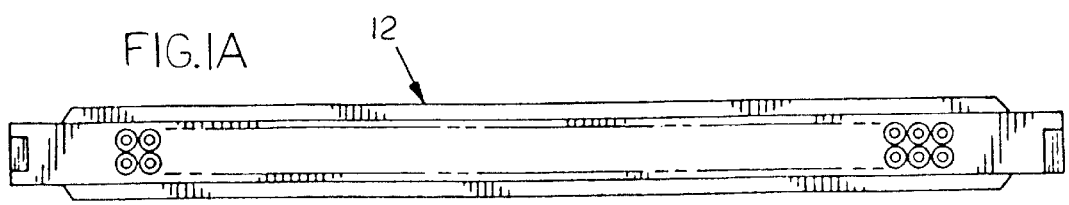

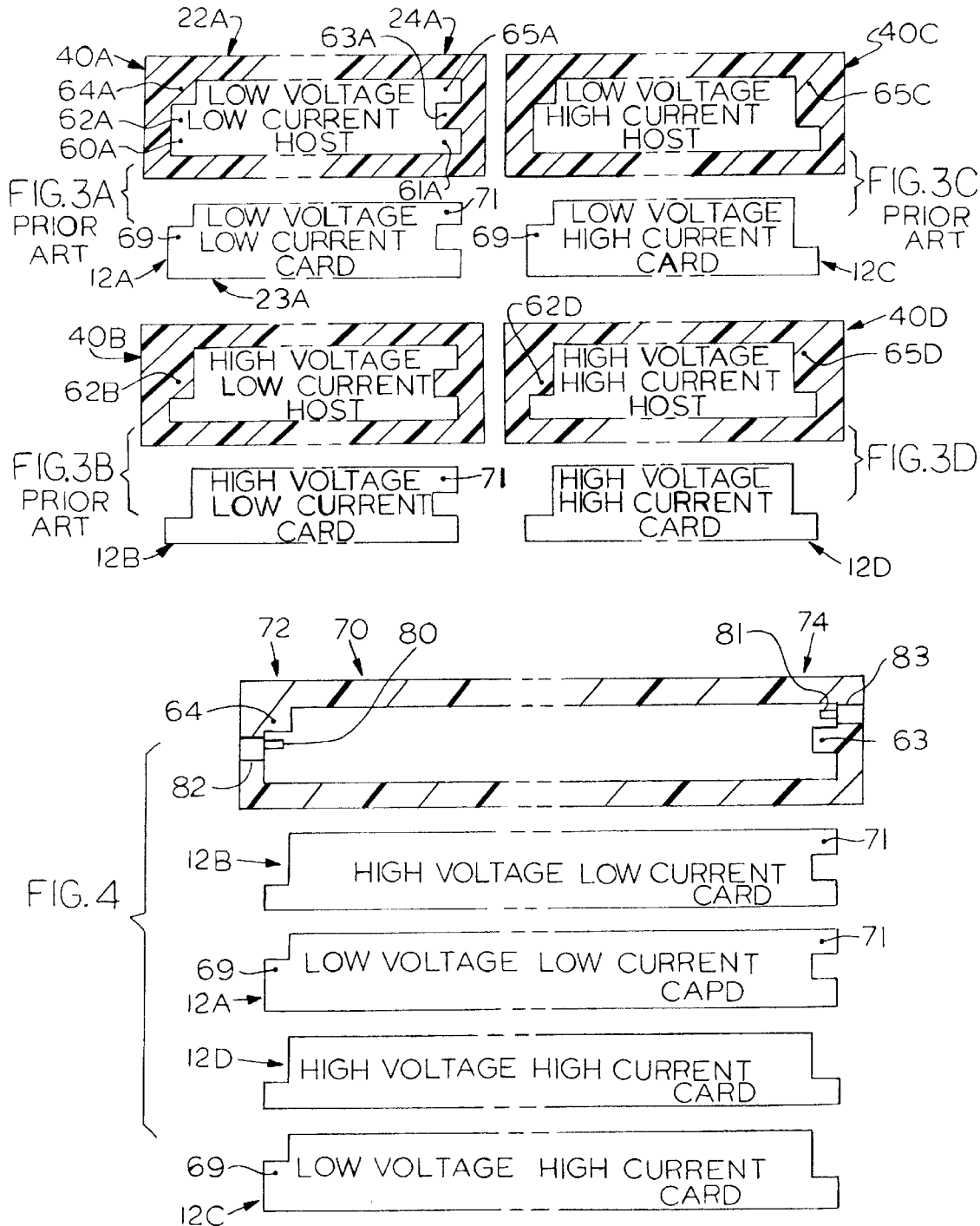

UNIVERSAL PC CARD HOST

CROSS-REFERENCE

This is a continuation-in-part of U.S. patent application Ser. No. 08/505,609 filed Jul. 21, 1995, now U.S. Pat. No. 5,627,416.

BACKGROUND OF THE INVENTION

PC cards, which are all about the same width and length as a typical credit card, are designed for insertion into a slot of a card-receiving host which may lie in an electronic device such as a notebook computer. The PCMCIA (Personal Computer Memory Card International Association) currently specifies two logic voltages that are in general use, these being nominally three volts (actually 3.3 V) and five volts (actually 5 V). Five volt cards require energization at about five volts and are designed to receive and generate digital signals of about five volts. Many newer electronic devices are able to use three volts in their logic circuits, which saves battery power, and are designed to operate with corresponding three volt IC cards.

At present, different host connectors, or hosts, are required for cards of different logic voltages. A high-voltage host will fully receive only a high-voltage card. A low voltage host will receive both high and low voltage cards, but the high voltage card will not operate properly when fully inserted. Low voltage cards cannot be inserted into high voltage hosts, because low voltage cards have a card discriminating key portion which will abut a barrier region in a high voltage host.

Recent PCMCIA standards and proposals specify low current cards which require current (at either 5 V or 3.3 V) of less than or equal to 0.120 ampere, and high current cards which may require current of more than 0.120 ampere. A host which is designed to operate at high current, should have conductors and usually circuit components that are designed to carry high currents without damage (with such components often being larger and more expensive). The new standards and proposals specify four different host designs for the four different combinations of voltages and currents. The host designs under the recent standards and proposals prevent a card from being inserted into a host that is designed for a higher voltage or current, but do not prevent card insertion into a host designed for a lower voltage or current. It would be desirable if an electronic device with a single card host therein, could fully receive and properly operate each of the four kinds of cards of the new PCMCIA standards.

SUMMARY OF THE INVENTION

In accordance with one embodiment of the present invention, an IC card-receiving host and an electronic device that holds such host, are provided, which enables circuitry in the electronic device to effectively interact with any of the four kinds of standard PC cards that may be inserted into the slot of the host. The slot in the host has an inner end with at least one laterally-extending row of contacts and with first and second opposite sides. The first side of the host slot has top, bottom, and middle regions, with the middle region being devoid of a barrier that is otherwise present in prior high voltage hosts to keep out low voltage cards. Instead, a switch is provided with an actuator lying at the middle region, to sense that an inserted card is a low voltage card.

The second side of the host has top, bottom, and middle regions, with the top region being devoid of a barrier that is otherwise present in prior high current host to keep out low current cards. Instead, a switch is provided with an actuator lying at the top region, to sense that an inserted card is a low current card.

The electronic device has a plurality of different circuit configurations that can each energize and/or interact with different voltage and current cards. When the switch or sensor senses a low voltage-low current card, it connects the pin contacts that lie at the inner end of the host slot, to a low voltage-low current circuit arrangement. When the switch senses a different one of the four volt-current cards, as when neither switch actuator is operated at a time when a card is fully inserted, a high voltage and high current circuit configuration is connected to the pin contacts at the inner end of the slot.

The novel features of the invention are set forth with particularity in the appended claims. The invention will be best understood from the following description when read in conjunction with the accompanying drawings.

BRIEF DESCRIPTION OF THE DRAWINGS

FIG. 1 is a partially section, exploded isometric view of a card-receiving host and an IC card.

FIG. 1A is a view taken on line 1A—1A of FIG. 1.

FIG. 2 is a partial sectional exploded view of a prior art host and card.

FIGS. 3A–3D is an exploded sectional view of the host and card of FIG. 2 with each view of the host taken on line A—A of FIG. 2 and each view of the card taken on line B—B of FIG. 2, for each of the four standard cards and hosts of the prior art.

FIG. 4 is an exploded sectional view of the host and card of FIG. 2 with a view of the host taken on line A—A of FIG. 2, and with a view of the card taken on the line of B—B of FIG. 2, for the host of the present invention and for each of the four standard types of cards.

DESCRIPTION OF THE PREFERRED EMBODIMENT

Figure 5:
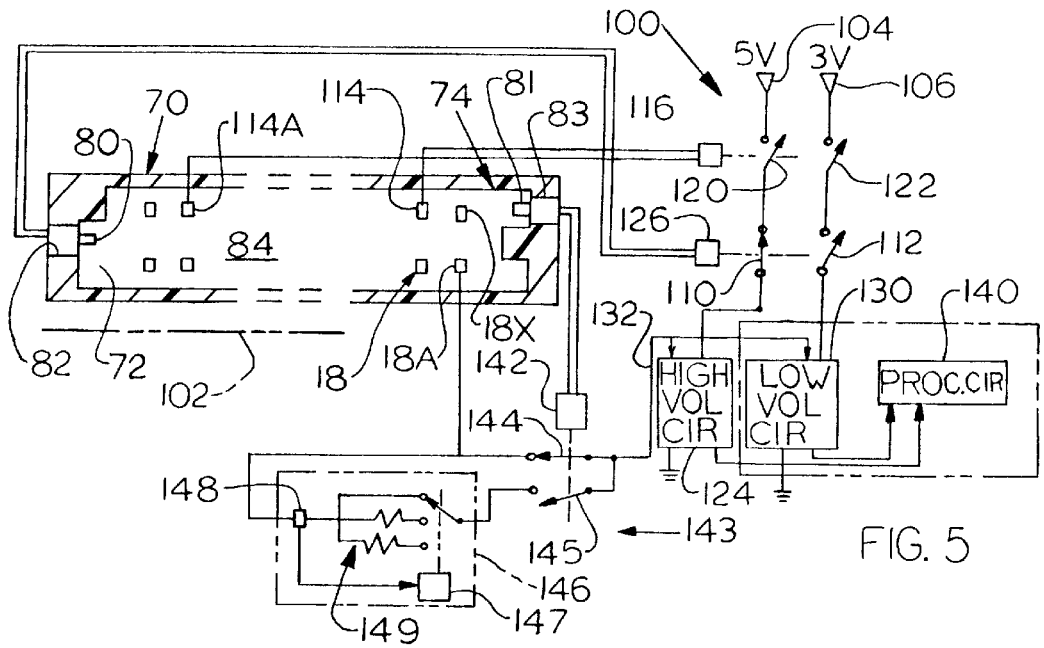
FIG. 5 is a sectional view of the host of FIG. 1 taken on line 5—5, and also showing circuitry of the electronic device.
Figure 6:
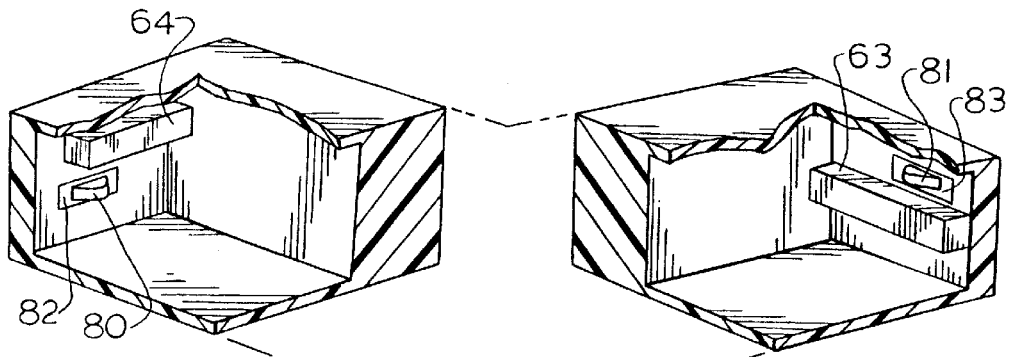
FIG. 6 is a sectional isometric view of a portion of the host of FIG. 5, but without showing the pin contacts.

FIG. 1 illustrates a card-receiving host 10 of the present invention, which is designed to receive an IC card or PC card 12 (usually a card containing an integrated circuit chip). The host has a card-receiving slot 14 that can receive a card inserted in an inward direction 1 (which is opposite to an outward direction O) until the card lies in a fully inserted position. The slot has an inner end 16, and has two rows of pin-type contacts 18 projecting outwardly from the slot inner end, for mating with card socket-type contacts 19. Each row of pin contacts in the host slot extends in a lateral direction L. The slot has an inner portion 20 with first and second laterally-spaced opposite sides 22, 24. The sides have orientation key barriers 63, 64 that assure that the card is inserted in a proper orientation (not upside-down) into the slot. The first side 22 is constructed to sense whether the IC card 12 is a high voltage (5 volts) card which has a high logic voltage, or a low voltage (3.3 volts) card which has a low logic voltage. The second side 24 is constructed to sense whether the PC card is a high current (can pass over 0.12 ampere) card, or is a low current (can pass only 0.12 ampere or less) card. It is noted that most high current cards can pass more than 0.13 amp but not more than 5 amps, so the high current range is generally 0 to a number that is not more than 5 amps.

Figure 8:
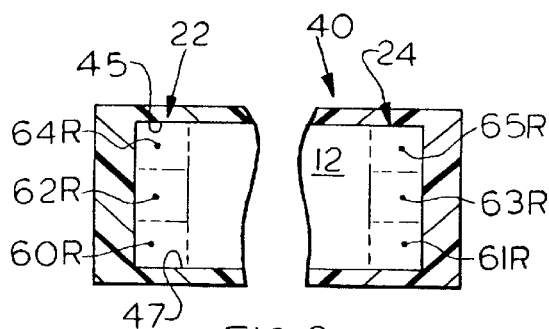
FIG. 8 is a view of a portion of the host of FIGS. 4 and 5, with different regions indicated in phantom lines.

FIG. 2 illustrates a portion of a prior art host 40, and of a present and prior art PC card 12 which can be inserted into the slot so pin contacts 42 of the host 40 can mate with socket contacts 19 in the card. Before the pin and socket contacts can mate, a forward end portion 44 of the card must pass across barriers 26, 46 lying at the opposite sides of the host slot 14. As shown in FIG. 8, which is taken on line A—A of FIG. 2, the first side 22 of the host slot 14 has a top and bottom 45, 47 and three regions therebetween. The three regions include an upper region 64, a lower region 60, and a middle region 62. Each region occupies about a third of the slot height. The presence or absence of a barrier at the middle region 62 of the host slot, previously has determined whether or not a low voltage card can be fully inserted into the host.

The second side 24 of the host slot has three regions between the top and bottom 45, 47. These include an upper region 65R, a lower region 61R, and a middle region 63R, that each occupies about a third of the slot height. The presence or absence of a barrier at the top region 65R of the host slot, previously has determined whether or not a low current card can be fully inserted into the host.

There are four kinds of PC cards, depending on whether they operate at a high or low voltage (5 or 3.3 volts), and depending on whether they can operate without damage at a high current (above 0.12 amp) or require a more limited current (0.12 amp or less). FIGS. 3A–3D illustrate a card and a prior art host of each of the four types. In each figure, the view of the prior art is taken on line A—A of FIG. 2 while the view of the card is taken on line B—B of FIG. 2.

FIG. 3A shows a prior art host 40A designed to receive a low voltage-low current card 12A. The first or voltage discriminating side 22A of the host has an orientation barrier at top region 64A to prevent upside-down insertion of a card, as do all hosts. The middle and lower regions 62A, 60A are empty to receive both high and low voltage cards. The second or current discriminating side 24A of the host has an orientation barrier at middle region 63A, while the bottom region at 61A is empty as are all hosts. The top region 65A is empty to receive both high and low current cards. The host 40A will receive any of the four kinds of cards 12A, 12B, 12C, 12D of FIGS. 3A–3D. The low voltage-low current card 12A has a voltage discrimination key 69 at the middle of its voltage-indicating side 23A, and has a current discrimination key 71 at the top of its current-indicating side.

FIG. 3B shows a prior art that 40B designed to receive a high voltage low current card 12B. The host 40B differs from the host of FIG. 2A in that host 40B has a low voltage barrier at 62B, to keep out low voltage cards. The high voltage-high current card 12D of FIGS. 3D can fit into host 40B but will not "work" if the card is operated in a mode that requires a lot of power (i.e. a lot of current at 5 V).

FIG. 3C shows a prior art host 40C designed to receive a low voltage-high current card 12C. The host 40C differs from the host 40A of FIG. 3 in that it has a low current barrier at 65C to keep out low current cards. The card 12D of FIG. 3D can fit into host 40C but will not "work" because it will not be energized at its required voltage of 5 V.

FIG. 3D shows a prior art host 40D designed to receive a high voltage-high current card 12D. The host 40D differs from the host of FIG. 3A in that host 40D has a low voltage barrier at 62D and a low current barrier at 65D. As discussed above, card 12D can fit into any of the four hosts of FIGS. 3A–3D, but will not work with the low voltage hosts and sometimes will not work with the low current host.

In the prior art, each host was only one of the four kinds shown in FIGS. 3A–3D. If an electronic device (e.g. computer) should have sufficient circuitry to effectively interact with cards of either voltage (5 V or 3.3 V) and of either range of currents (0 to 0.12 amps, and 0 to e.g. 1.2 amps), then in order to do so, such electronic device would require four separate hosts as shown in FIGS. 3A–3D. The present invention permits an electronic device with appropriate circuitry, to interact with two or more different types of cards (high or low voltage combined with high or low current), using a single host and single host slot. Of course, the electronic device may have a plurality of hosts, but in that case, each host may be capable of operating cards of a plurality of different volt-current characteristics.

FIG. 4 illustrates a "universal" host 70 of the present invention which has barriers 64, 63 at its opposite sides 72, 74. The host barriers 64, 63 are in the same positions as those of the host 40A of FIG. 3A which can receive any standard type of card. However, in FIG. 4 each host side has a switch actuator 80, 81 of a switch 82, 83, respectively, to detect the voltage type and current type of the inserted card. If voltage actuator 80 is operated when a card is inserted, this indicates the insertion of a low voltage card. This is because voltage actuator 80 sense the voltage discriminating key 69 of a low voltage card. A lack of operation of voltage actuator 80 when a card is inserted indicates the presence of a high voltage card. Similarly, if current actuator 81 is operated when a card is inserted, this indicates the insertion of a low current card. This is because current actuator 81 senses the current discriminating key 71 of a low current card. A lack of operation of the current actuator indicates the presence of a high current card.

FIG. 5 shows a switchable voltage and current-sensitive circuit 100 that is part of the electronic device 102 that contains the host 70 and the circuit 100. This circuit includes a high voltage source 104 and a low voltage source 106. For the particular circuit 100, a high voltage switch 110 is initially closed, while a low voltage switch 112 is initially open. If a high voltage card is inserted into the host, such high voltage card will not operate the switch 82 and the high voltage switch 110 will remain closed. When such high voltage card is fully inserted, a card-sensing contact 114 will sense the full insertion, and will operate an electronic relay indicated at 116 which will close two power switches 120, 122. Only closure of the high voltage power switch 120 will be significant, and upon its closure, current can flow from the high voltage supply 104 through the switches 120, 110, to a high voltage circuit 124 of the circuit assembly 100 (and through a current range selector 143 to the card to energize it).

If a low voltage card of the type shown at 12A or 12C in FIG. 4, is inserted into the host 70 of FIG. 5, then the voltage discrimination key portion 69 of the card will operate the voltage switch actuator 80 to close the voltage-sensing switch 82. Current passing through the switch 82 will operate an electronic relay 126 to change the states of both switches 110, 112. That is, the high voltage switch 110 will open while the low voltage switch 112 will close. Full insertion of the card is sensed by short contacts 114, 114A, which can connect to relay 116. When the card is fully inserted, as sensed by the card insertion contacts 114, 114A, so switch 122 is closed, current can flow from the low voltage source 106 through a low voltage circuit 130 (and through current range selector 143 to the card to energize it). Thus, the electronic device has separate circuits 124, 130 that each operate at a different voltage, and with a selected one of the circuits 124, 130 being energized depending upon whether the full insertion of a high voltage card is sensed (by engagement of contact 114 and by absence of operation of switch 82) or a low voltage card is sensed (by contact 114 and operation of switch 82).

Most of the pin contacts 18 such as pin 18A are connected to both circuits 124, 130, as indicated by line 132, so each circuit 124, 130 can receive and send data signals of appropriate voltage to and from the inserted card through the pin contacts. A pair of power pin contacts are connected so power from a selected voltage source 104, 106 can energize the card through the power pin contacts (e.g. pin contact 18X). A current limiter preferably is connected in series with the power pin contacts. The circuit assembly 100 includes a large processing circuit 140 that is designed to be energized by a low voltage (3 volts) and which has a corresponding low logic voltage. Interaction of the large circuit 140 with the low voltage circuit 130 is relatively straight forward. The high voltage circuit 124 preferably converts high voltage logic to low voltage logic signals which it transmits and receives to and from the large circuit 140. The large circuit 140 may consume considerable power, and its operation at a low voltage can generally result in a lower power consumption to achieve a longer battery life. The high voltage circuit 124 may contain a limited number of components so that it may consume only a limited amount of power. The high voltage source 104 therefore may be obtained from a high voltage battery of limited capacity, or by electronically boosting the output of the low voltage source 106, for a portable electronic device. Thus, even when a high voltage card is to be interfaced with, the circuit assembly 100 can take advantage of the lower power consumption of the low voltage large circuit 140.

When a low current card (of high or low voltage) is inserted into the host 70 of FIG. 5, then the current discrimination key 71 (FIG. 4) of the card will operate the current switch actuator 81 to close the current-sensing switch 83. Current passing through the switch 83 operates an electronic relay 142 (FIG. 5) of a current range selector 143 to change the states of its two switches 144, 145. That is, the high current switch 144 will open while low current switch 145 will close and pass current through a current limiter 146. The current limiter 146 has a control 147 that senses current at 148 and that passes current through a selected resistance so as to limit the current to 0.12 ampere. In one example, the low current switch 145 passes current, such as from one of the voltage sources 104, 106 and a corresponding circuit 124, 130 through one of a plurality of resistors 149 (one resistor has zero resistance) to limit current flow through a pin contact 18 that supplies power circuitry in the card (or that is connected to further circuits through the rear of the card). Instead of the current range selector 143, it is possible to provide the electronic device that contains (or is connected to) the host with current limiting subcircuits in each circuit 124, 130. It is also possible to instead provide four different circuits for each of the four types of cards including a separate high current source at each voltage level, or other arrangements to operate cards of different current and voltage levels.

Figure 7:
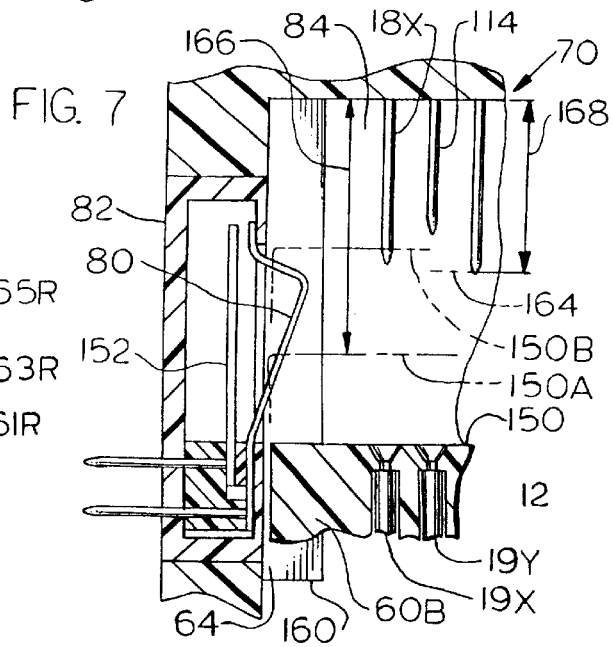
FIG. 7 is a view taken on line 7—7 of FIG. 6, showing some of the pin contacts, and including a sectional view of a partially inserted card.

FIG. 7 shows a low voltage card 12 (low or high current) in the course of its insertion into the host slot 84. At the position shown in solid lines at 12 in FIG. 7, the leading edge 150 of the card has passed an outwardly-facing shoulder 160 of a host orientation key barrier 64, but not yet encountered the switch actuator 80. When the leading edge reaches the position 150A, it will have encountered the voltage actuator 80 and deflected it sufficiently for the actuator 80 to engage a switch contact 152, and thereby close the switch. If the card is a low current card, then its opposite side will also have encountered the current actuator 81 and deflected it to close the current switch 83 at the same time. When the leading edge of the card has reached the position 150B, a card socket contact 19X will first engage a host pin contact 18X. The card leading edge position 150B is slightly inward of contact line 164 which lies at the outer ends of the pins. After further inward movement of the card, a card contact 19Y will engage the card sensing contact 114 of the host. The distance 166 to the position 150A where the switch is actuated, is preferably between 5 mm (which is the distance 168) and 10 mm.

Although mechanical actuators 80 are shown for use in sensing the presence of a low voltage and/or low current card to operate a switch, it is also possible to use other switching devices such as a proximity switch to sense the presence of the card discriminating key 69 and/or 71 to operate a corresponding switch(s).

Although terms such as "top", "bottom", etc., have been used herein to describe the prior art and the present invention as illustrated, it should be understood that it is possible for the host and card to be used in any orientation with respect to the gravity.

Thus, the invention provides an IC card receiving host, and an electronic device that includes such host, which enables a single host to receive and effectively operate on both high voltage (e.g. 5 volts nominal) and low voltage (e.g. 3 volts nominal) cards, of either low current (0.12 amp or less) or high current capability., The host has a pair of switches that each has an actuator which senses a key portion that is normally occupied by a card discrimination key (69, 71) of one type of card such as the low voltage card or low current card, but not the other card such as the high voltage card or high current card. Thus, the presence of only one type of card operates a selected one or both switches. The electronic device can include a plurality of circuit configurations such as both high and low voltage circuits, with only a selected one of them being energized and capable of interacting with an installed card, depending on whether the voltage switch is operated or not. The electronic device also has a current limiting circuit that limits current or allows a high flow of current, depending upon whether or not a current switch is operated.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card-receiving host that has a card-receiving slot with first and second sides, wherein said slot can receive any one of four types of PC cards comprising low-voltage-low current cards, low voltage-high current cards, high voltage-low current cards, and high voltage-high current cards, where each of said four types of cards is designed to operate at a different combination of first or second voltages and first or second current ranges, and wherein said cards each have first and second sides that indicate the particular type of card, wherein each low voltage card has a voltage discrimination key at the first side of the card but each high voltage card does not, and each low current card has a current discrimination key at its second side but each high current card does not, characterized by:

voltage and current sensing switches mounted on said host;

said voltage sensing switch is located at said card host first side and has an actuator positioned to be operated by the voltage discrimination key of a low voltage card;

said current sensing switch is located at said card host second side and has an actuator positioned to be operated by the current discrimination key of a low current card;

circuitry that can be switched, connected to said voltage and current switches.

2. The host described in claim 1 wherein:

said slot has an inner end portion, said host has contacts at said inner end portion, and said slot has a slot top and a slot bottom;

said first side of said slot inner end portion has top, bottom, and middle regions lying between said slot top and said slot bottom, with said top region having a barrier to the inward passage of a card portion thereat, and with said top and middle regions being devoid of a barrier but with said switch actuator lying in said middle region;

said second side of said slot inner end portion has top, bottom, and middle regions lying between said slot top and said slot bottom, with said middle region having a barrier to the inward passage of a card portion thereat, and with said top and middle regions of said second side being devoid of a barrier but with said actuator of said current switch lying in said top region.

3. The host described in claim 1 wherein:

said host slot has an open outer end and a primarily closed inner end, and said host has at least one laterally-extending row of pin contacts lying at said slot inner end between said first side and said second side, said pin contacts extending in an outward direction from said slot inner end, with said pins having outer ends extending no further outward from said slot inner end than a predetermined imaginary laterally extending contact line;

said host has a barrier at at least one of said sides, which has an outwardly-facing barrier shoulder lying at a shoulder portion which is outward of no said contact line;

at least one of said actuators has a card engaging part that lies in said slot at a position that is outward of said contact line but inward of said barrier shoulder.

4. An electronic device that can receive low and high current PC cards, comprising:

an electrical source for flowing current to a PC card, said source being switchable to supply current at no more than a first current level or to supply current of a magnitude that can exceed said first level;

a card-receiving host which has a card-receiving slot and at least one laterally-extending row of pin contacts;

a switching device which is operable to switch said source to energize a PC card lying in said slot, and a sensor which selectively senses the presence of a low current PC card and a high current card and which switches said source so it can supply current of a magnitude that is no more said than said first current level only when said sensor senses a low current PC card.

5. The electronic device described in claim 4, wherein:

said host slot has an inner end portion with laterally spaced first and second sides that each have a top and a bottom, and that each have upper, lower and middle regions that are each of a height of more than one sixth the distance between said top and said bottom;

said pins project outwardly from said inner end of said slot, and said sensor is positioned to sense the presence or absence of a card portion in said upper region of said second side of said slot, to respectively switch said source to apply no more than said first current level to a first of said pins, and to instead allow said source to apply more than said first current level, to said first pin.

6. The electronic device described in claim 4 wherein:

said electronic device is capable of receiving both low and high voltage-type cards, of either low or high current type, where said low voltage cards are designed to operate at about 3.3 volts and said high voltage cards are designed to operate at about 5 volts;

said source has high and low voltage circuits and said host has a sensor means for sensing the voltage type of a card and which establishes said source to cause the circuit of proper voltage to supply electricity to the card whose voltage type has been sensed.

7. A method for operating an electronic device with a host that has a card-receiving slot, to receive and energize any of four types of cards, namely low voltage-low current cards, low voltage-high current cards, high voltage-low current cards, and high voltage-high current cards, where low voltage cards have card discriminating keys at a middle location of a first side of the card but high voltage cards do not have such keys, and where low current cards have card discriminating key portions at a top location of a second side of the card but high current cards do not, wherein said electronic device can be switched to effectively operate any of said four types of cards, comprising:

sensing the installation in said slot of a particular one of said four types of cards and switching said electronic device to operate a card of a selected voltage type and a selected current type upon said sensing.

\* \* \* \* \*